(12) United States Patent
Kim et al.

(10) Patent No.: US 6,780,734 B2
(45) Date of Patent: Aug. 24, 2004

(54) WAFER TABLE AND SEMICONDUCTOR PACKAGE MANUFACTURING APPARATUS USING THE SAME

(75) Inventors: Jae-Hong Kim, Cheonan (KR); Heui-Seog Kim, Cheonan (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/638,360

(22) Filed: Aug. 12, 2003

(65) Prior Publication Data
US 2004/0038499 A1 Feb. 26, 2004

(30) Foreign Application Priority Data
Aug. 26, 2002 (KR) .......................................... 2002-50495

(51) Int. Cl.⁷ .......................... H01L 21/44; H01L 21/46; H01L 21/78
(52) U.S. Cl. ........................ 438/464; 438/113; 257/723
(58) Field of Search .......................... 257/723, 778–784; 438/106, 113–116, 458, 460–464

(56) References Cited

U.S. PATENT DOCUMENTS 5,618,759 A    4/1997   Boysel
6,121,118 A  *  9/2000   Jin et al. .................... 438/460

FOREIGN PATENT DOCUMENTS

JP       10-321562       4/1998
KR    102000003432 A     6/2000
KR    1020010029981 A    4/2001

* cited by examiner

Primary Examiner—Cardid Everhart
Assistant Examiner—Calvin Lee
(74) Attorney, Agent, or Firm—Harness Dickey

(57) ABSTRACT

A wafer table for supporting a wafer during the sawing process without the use of wafer backing tape and providing for the support and independent elevation of individual chips separated by the sawing process is disclosed. Also disclosed are a series of semiconductor manufacturing assemblies utilizing such a wafer table and methods of using such wafer tables.

20 Claims, 10 Drawing Sheets

WAFER TABLE AND SEMICONDUCTOR PACKAGE MANUFACTURING APPARATUS USING THE SAME

BACKGROUND OF THE INVENTION

This U.S. nonprovisional patent application claims priority under 35 U.S.C. § 119 from Korean Patent Application 2002-50495, filed Aug. 26, 2002, the entire contents of which is hereby incorporated by reference.

1. Field of the Invention

The present invention relates to a wafer table for supporting a wafer during sawing and chip removal operations, a semiconductor package manufacturing apparatus using such a wafer table and a method of using such.

2. Description of the Prior Art

A conventional semiconductor package manufacturing process typically comprises forming an electric circuit on a wafer, attaching a wafer tape to the lower surface of the wafer, sawing the wafer into individual chips (also referred to as dies), bonding one or more individual chip(s) to a board such as a lead frame or a printed circuit board, electrically connecting the individual chip(s) to the board, and encapsulating the chip(s) and the electrical connections.

In conventional wafer sawing processes, an adhesive wafer tape is applied to the rear surface of a wafer for maintaining the orientation of the individual chips as they are separated during the sawing process. The use of wafer tape, however, requires that a separate tape mounting process be performed before the sawing process may begin. The use of the wafer tape may also lead to contamination of the lower wafer surface that may reduce the reliability of the resulting semiconductor package(s).

In order to reduce problems associated with wafer tape, a wafer sawing apparatus and a tapeless wafer sawing process are disclosed in KR2000-34632A and U.S. Pat. No. 5,618,759. These references fasten the individual chips to a wafer table by using a plurality of vacuum chip absorbers rather than wafer tape. However, the process of picking a specific chip may still result in mechanical interference between the picked chip and adjacent chips and the loss of the vacuum force of the chip absorber as the individual chips are picked up.

In addition, when manufacturing Wafer Level Chip Size Packages (WL CSPs), i.e., chips on which a plurality of conductive bumps are formed, it is difficult to load the WL CSPs directly into sorting trays. Such loading involves turning the WL CSPs upside down, but because the distance between adjacent WL CSPs tends to be very small, the WL CSPs typically need to be transferred first onto a reversing table where they are flipped before being loaded into a sorting tray.

SUMMARY OF THE INVENTION

Exemplary embodiments of the invention provide a wafer table that can hold a wafer without using wafer tape and can separately transfer each of the individual chip without mechanical interference between the transferred chip and adjacent chips.

The exemplary embodiments of the invention also provide a semiconductor package manufacturing apparatus for carrying out wafer sawing and die bonding processes as an integrated process by using a wafer table according to the invention.

The exemplary embodiments of the invention also provide a semiconductor package manufacturing apparatus for carrying out wafer sawing and Wafer Level Chip Size Package (WL CSPs) loading as an integrated process using a wafer table according to the invention.

A wafer table according to an exemplary embodiment of the invention comprises an absorption plate, a plurality of chip absorbers, and a vacuum source. The absorption plate supports the wafer, and preferably has sawing guide grooves aligned with and positioned under the scribe lines on the wafer. The sawing guide grooves are preferably wider than the scribe lines and deeper than the lowest extension of the cutting means used in the wafer sawing process. Each of the chip absorbers comprises a mounting plate, a vacuum line connected to the mounting plate, and a driving means for selectively moving the associated chip absorber up and down. Each of the chip absorbers is installed on the absorption plate and corresponds to an individual chip on the wafer being processed. The vacuum source is connected to each of the chip absorbers respectively and provides vacuum to the mounting plate.

A semiconductor package manufacturing apparatus using the disclosed wafer table comprises a board supplying means, an alignment station, a sawing station, a cleaning station, a die bonding stage and die bonding means. The alignment station aligns the wafer as it is received from a wafer carrier. The sawing station is typically arranged near the alignment station and is arranged to saw the wafer along the scribe lines to separate the individual chips. The cleaning station is typically installed near the sawing station and is used to remove debris from the sawed wafer and the wafer table after the sawing process has been completed.

The die bonding stage is typically installed near the cleaning station for receiving the wafer table supporting the individual chips from the cleaning station after the cleaning process has been complete. The board supplying means preferably comprises a board carrier for holding boards and a board conveyer for transferring the boards to the die bonding stage. The die bonding means is typically arranged to move between the board conveyer and the die bonding stage to remove individual chips from the wafer table and bond the chips onto boards arranged on the board conveyer. The die bonding means picks up an individual chips as it is elevated by movement of the corresponding chip absorber and moves it to a predetermined location on the waiting board where it is bonded into place.

The wafer table is configured to allow sequential movement between the sawing station, the cleaning station and the die bonding stage during the wafer sawing/die bonding process. Preferably, the sawing station and the cleaning station each includes a chamber capable of enclosing and sealing the wafer table during operation to reduce the chance of contamination.

Preferably, the semiconductor package manufacturing apparatus will also include a waste receptacle into which debris from the wafer table may be discharged. The wafer table will then typically be returned to the alignment station to receive a new wafer after the debris has been discharged into the waste receptacle.

Preferably, two or more wafer tables can be operated simultaneously and sequentially among the sawing station, the cleaning station and the die bonding stage for increasing the efficiency and throughput of the wafer sawing/die bonding process.

Another semiconductor package manufacturing apparatus using an exemplary wafer table according to the invention comprises an alignment station, a sawing station, a cleaning station, a chip sorting stage, a chip sorter and a sorting tray.

The alignment station aligns a wafer transferred from a wafer carrier. The sawing station is typically installed near the alignment station and saws the wafer aligned on the wafer table into individual elements such as chips, especially WL CSPs. The cleaning station is typically installed near the sawing station to remove debris from the sawed wafer and the wafer table and a chip sorting stage is typically installed near the cleaning station.

The wafer table is preferably configured to permit movement from the cleaning station to the chip sorting stage after the cleaning process has been completed. The chip sorter is typically installed near the chip sorting stage for sorting the individual chips held on the wafer table. The sorting tray receives and stores the individual chips transferred by the chip sorter. During the wafer sawing/chip sorting process, the wafer table moves sequentially through the sawing station, the cleaning station and the chip sorting stage. The chip sorter picks up the individual chips, such as WL CSPs, as they are elevated by movement of the corresponding chip absorbers and transfers them to the sorting tray. Preferably, each of the sawing station and the cleaning station has a chamber sealing the wafer table during operation to reduce the chance of contamination.

Preferably, the semiconductor package manufacturing apparatus includes a waste receptacle into which debris on the wafer table from the saving operation is discharged. In addition, before the wafer table returns to the alignment station after the chip sorting process, any remaining debris on the wafer table is typically discharged into the waste receptacle.

Preferably, two or more wafer tables can be simultaneously and sequentially operated between the sawing station, the cleaning station and the chip sorting stage for increasing the efficiency and throughput of the wafer sawing/chip sorting process.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF EXEMPLARY EMBODIMENTS

Figure 1:
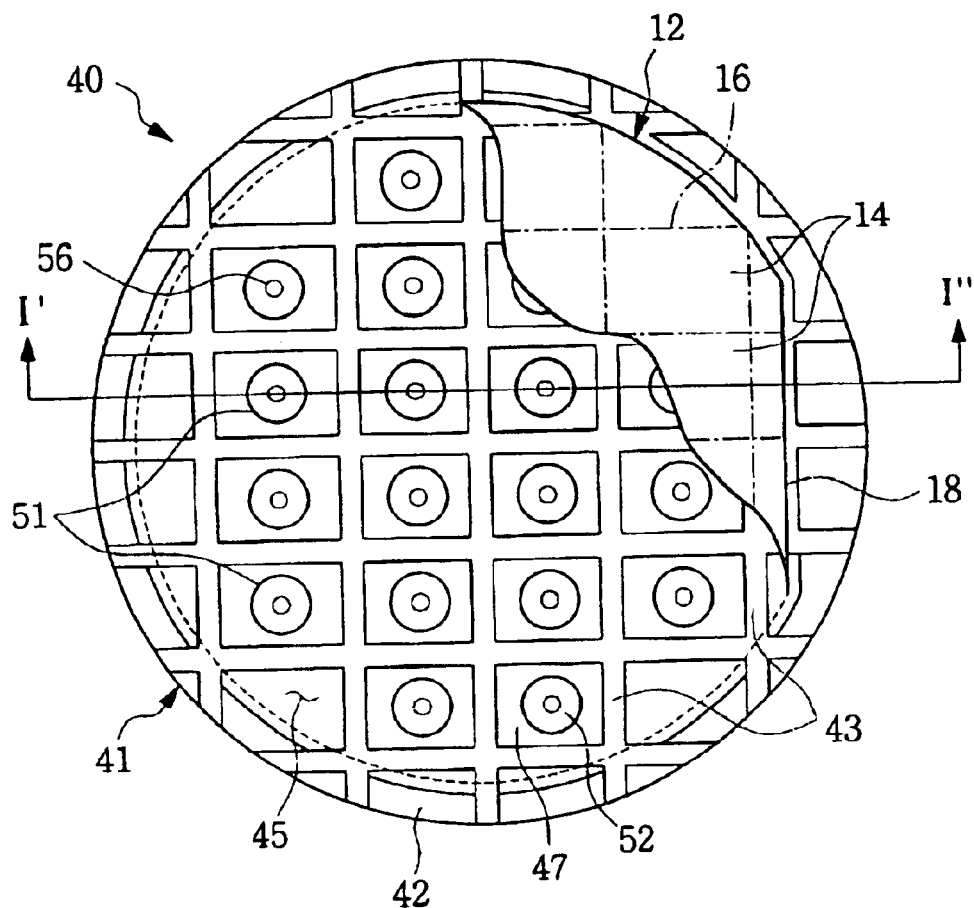
FIG. 1 shows a first exemplary embodiment of a wafer table according to the invention.
Figure 2:
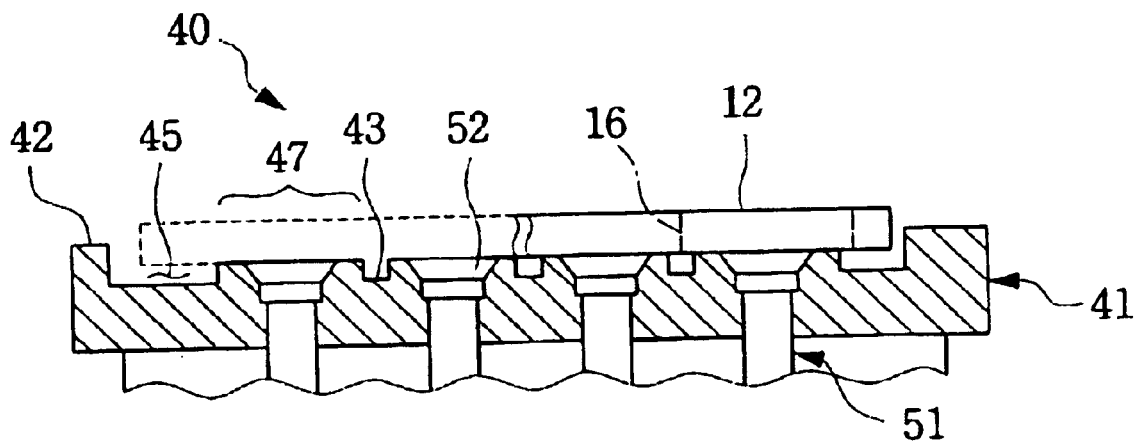
FIG. 2 is a cross sectional view of FIG. 1 along line 2'–2"

As shown in FIGS. 1 and 2, the wafer table 40 supports and carries a wafer 12 to the sawing process and then to the die bonding process by holding the wafer 12 to the wafer table with a vacuum. The wafer table 40 comprises an absorption plate 41, a plurality of chip absorbers 51 and a vacuum source 49.

The absorption plate 41 supports the wafer 12 and has sawing guide grooves 43 along which the sawing means moves. The sawing guide grooves 43 are aligned with and correspond to the scribe lines 16 provided on the wafer at the boundaries of the individual chips formed on wafer 12.

The sawing guide grooves 43 preferably extend through the edge 42 of the absorption plate 41. The sawing guide grooves 43 are preferably wider than the scribe lines 16, and deeper than the lowest extension of the sawing means to reduce the likelihood of damage to sawing means or the wafer table 40. In the exemplary embodiment illustrated, the wafer 12 includes a single flat zone 18, however, in other embodiments the wafer mounting area 45 may have a circular shape or may accommodate both major and minor flats formed on the wafer.

The chip absorbers 51 are arranged to provide a one-to-one correspondence to the individual chips and are configured to provide selective vertical movement from the plane of the absorption plate 41. Each of the chip absorbers 51 comprises a mounting plate 52 and a driving means (not shown) for selectively moving the chip absorber 51 up and down. The mounting plate 52 is arranged within the chip mounting area 47 and preferably has a conical shape that interacts with a corresponding opening in the absorption plate 41 to limit the downward movement of mounting plate 52. And although in the illustrated embodiment the mounting plate 52 has a circular shape, elliptical, rectangular or other shapes can be used for the mounting plate 52.

Figure 3:
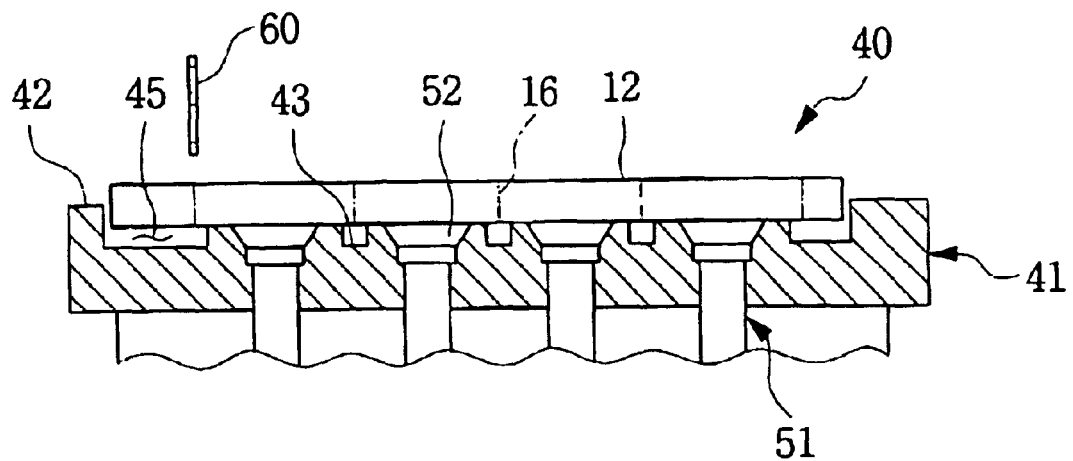
FIG. 3 and FIG. 4 are cross sectional views showing a wafer before and after it has been sawed into individual chips.
Figure 4:
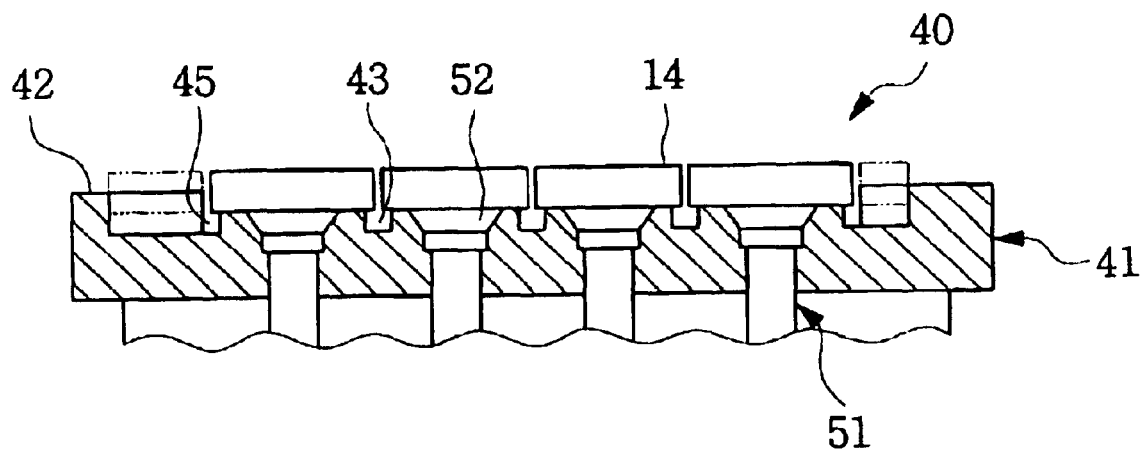

The sawing process will be described referring to FIGS. 3 and 4. The wafer 12 to be sawed is received from a wafer carrier, aligned on the wafer mounting area 45 of the absorption plate 41 and fastened to the wafer table 40 by the chip absorbers 51. The wafer is then moved to the sawing station 23 where the scribe lines 16 of wafer 12 are cut completely through by the cutting means 60 to separate the wafer into individual chips 14.

Figure 5:
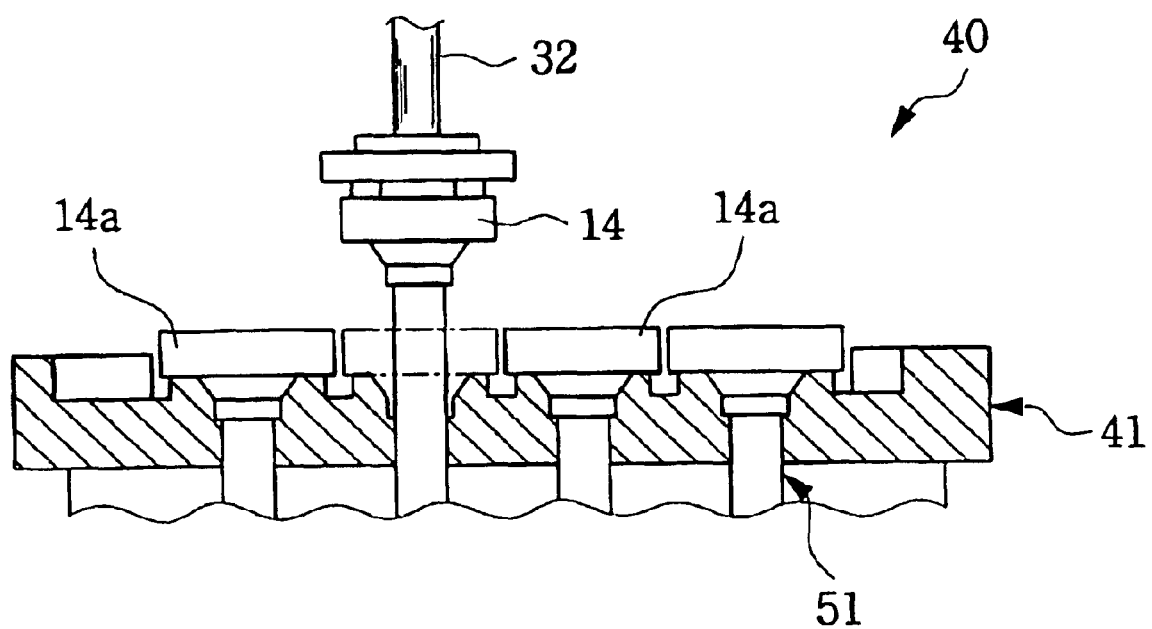
FIG. 5 illustrates a die bonding means receiving an individual chip from an elevated chip absorber.

After the sawing process, the wafer table 40 is transferred to a cleaning station for a cleaning process to remove debris generated during the sawing process. The cleaned wafer table 40 and chips 14 are then moved to a die bonding station. An individual chip 14 to be bonded to a board may then be separated from the other individual chips 14a by upward movement of the corresponding chip absorber 51 as shown in FIG. 5.

More specifically, the chip absorber 51 selectively elevates the individual chip 14 to a predetermined height where a die bonding device 32 moves to and removes the elevated individual chip 14 from the chip absorber. At that time, the absorbing force of the chip absorber 51 holding the individual chip 14 is reduced to allow the die bonding device 32 to pick up the individual chip 14. Next, the die bonding process is performed by attaching the chip 14 to a board provided on the board conveyer.

According to exemplary embodiments of the invention, the die bonding device 32 picks up the individual chip 14 after the individual chip 14 is elevated to a predetermined height and is vertically separated from the other individual chips 14a, thereby reducing the likelihood of mechanical interference between the individual chip 14 and the other individual chips 14a.

Figure 6:
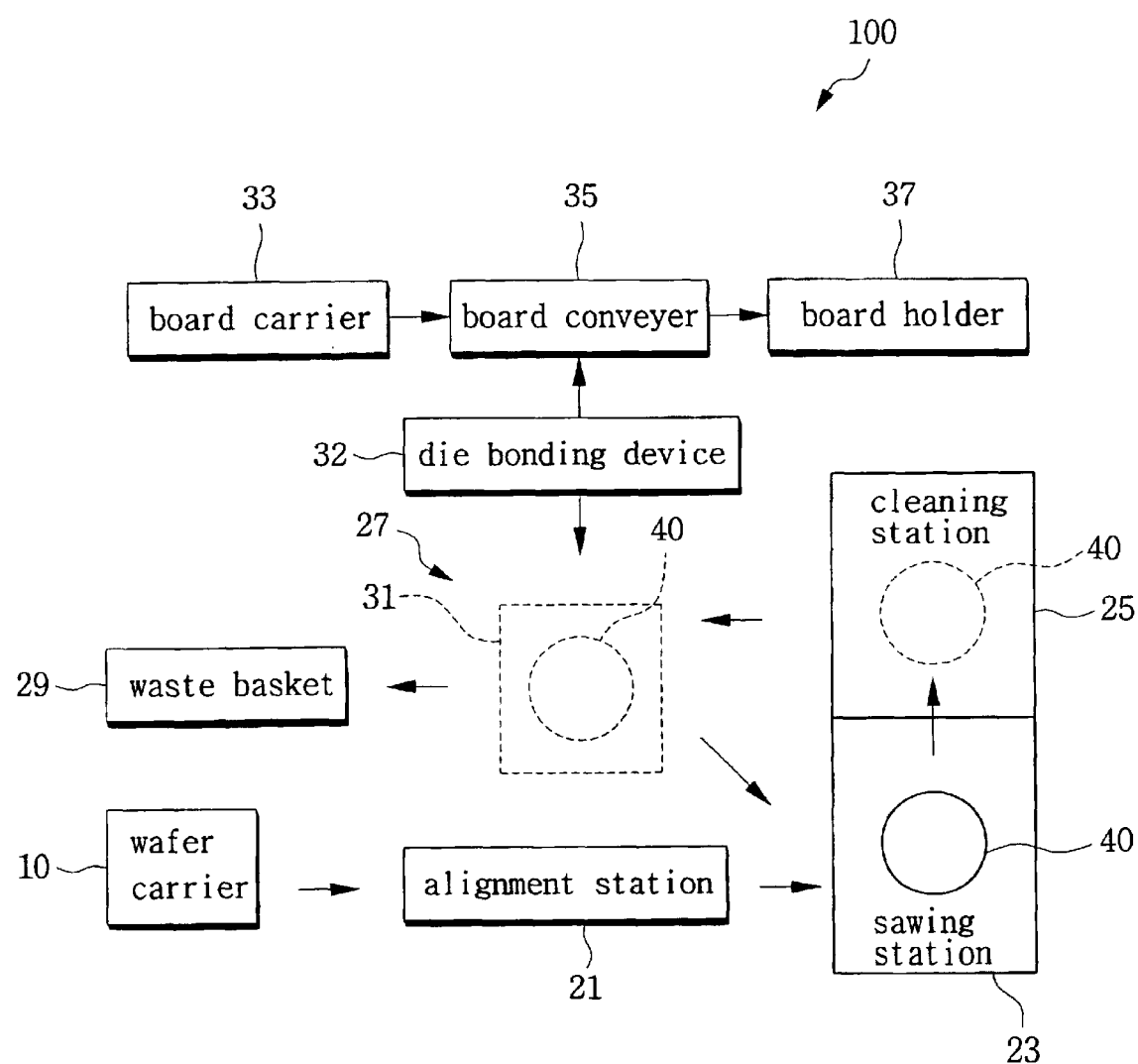
FIG. 6 shows a semiconductor package manufacturing apparatus according to the first exemplary embodiment of the invention.

A semiconductor package manufacturing apparatus 100 using an exemplary wafer table according to the invention is shown schematically in FIG. 6. The semiconductor package manufacturing apparatus 100 preferably carries out the sawing and the die bonding operations as an integrated process. As shown in FIG. 6, an alignment station 21 may be installed near a wafer carrier 10 for receiving and aligning a wafer transferred from the wafer carrier 10 in preparation for the wafer sawing process. A sawing station 23 is installed near the alignment station 21, and is equipped with a cutting or sawing means, such as a diamond blade, for separating the wafer supported on wafer table 40 into individual chips. A cleaning station 25 is installed near the sawing station 23 for removing debris such as silicon powder or dust generated during the sawing process from the chips and the wafer table 40. A die bonding station 27 is installed near the cleaning station 25 for bonding the individual chips from the wafer table 40 to boards. The die bonding station 27 preferably comprises a die bonding stage 31, a board carrier 33 for maintaining boards such as lead frames, printed circuit boards or tape circuit boards, a board conveyer 35 for conveying the boards from the board carrier 33 to the die bonding process, a die bonding device 32 for picking up the individual chips and bonding the individual chips to boards, and a board holder 37 for receiving and keeping boards to which the chips have been bonded.

The board conveyer 35 is preferably located adjacent the board carrier 33 with the die bonding device 32 arranged to move between the wafer table 40 in the die bonding stage 31 and the board conveyer 35. The board holder 37 is preferably located at the opposite end of the board conveyer 35 from the board carrier 33.

Debris, such as malfunctioning chips or the non-patterned edges of the wafer, is preferably discharged into a receptacle 29 located between the board carrier 33 and the wafer carrier 10. The wafer table 40, once substantially free of the debris, is transferred from the die bonding stage 31 to the alignment station 21 or sawing stage 23 to receive a new wafer. Throughout this process, the wafer table 40 continues to move between the sawing station 23, the cleaning station 25 and die bonding stage 31.

The stations of the semiconductor package apparatus 100 are preferably arranged in a space-saving manner. For example, the alignment station 21, the sawing station 23, the cleaning station 25 and the die bonding stage 31 may be arranged to form a rectangular shape. In addition, the board carrier 33, the board conveyer 35 and the board holder 37 may be located in front of the cleaning station 25 and die bonding stage 31.

Further, although the exemplary embodiment as described references only one wafer table 40, two or more wafer tables can be operated at the same time and move sequentially through the various stations. In addition, the sawing station 23 and the cleaning station 25 each preferably provide a chamber for substantially enclosing the wafer table 40 during the respective sawing and cleaning processes, in order to reduce the chance that materials used in or generated during the sawing process and/or the cleaning process may contaminate other devices or equipment.

Figure 7:
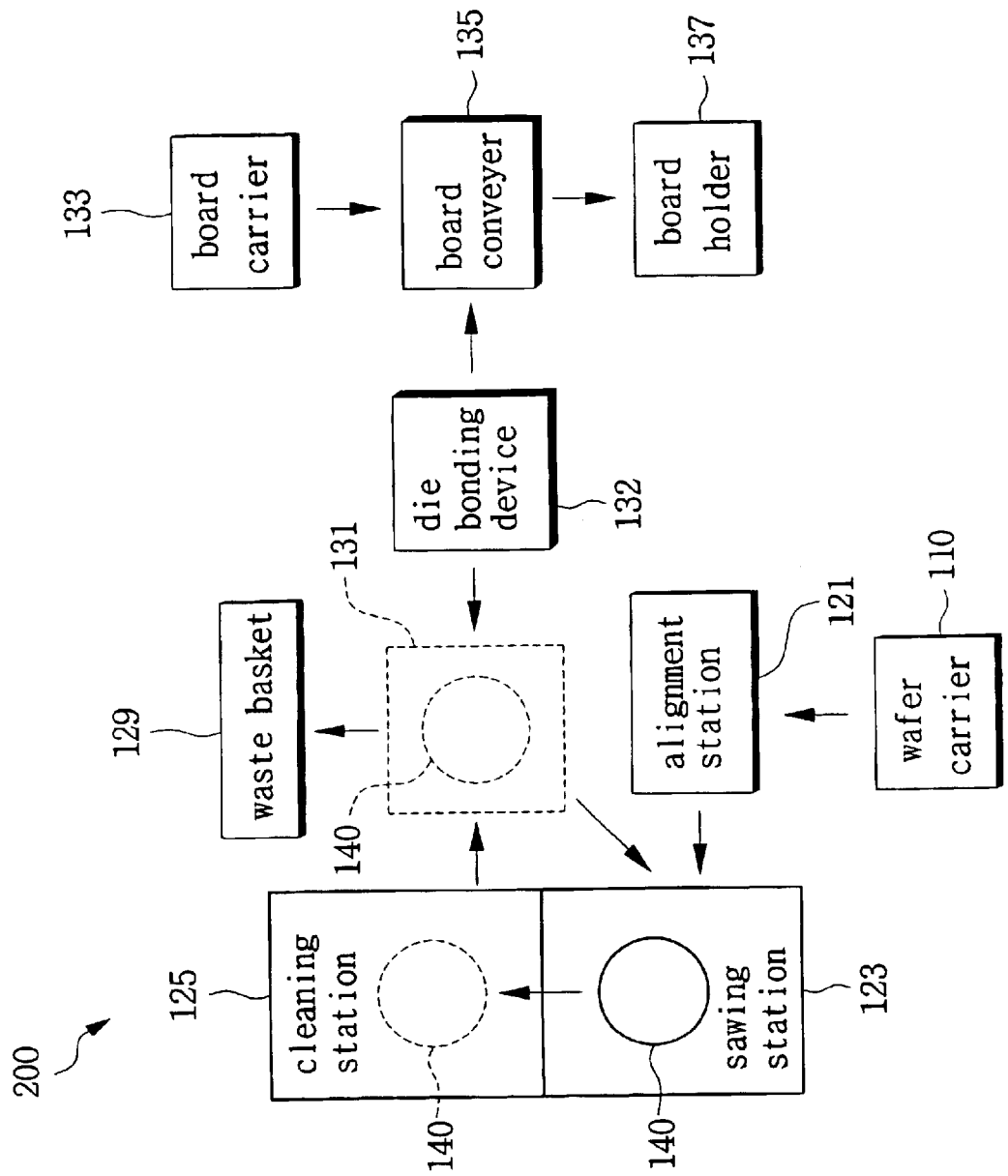
FIG. 7 shows a wafer sawing/die bonding apparatus according to a second exemplary embodiment of the invention.
Figure 8:
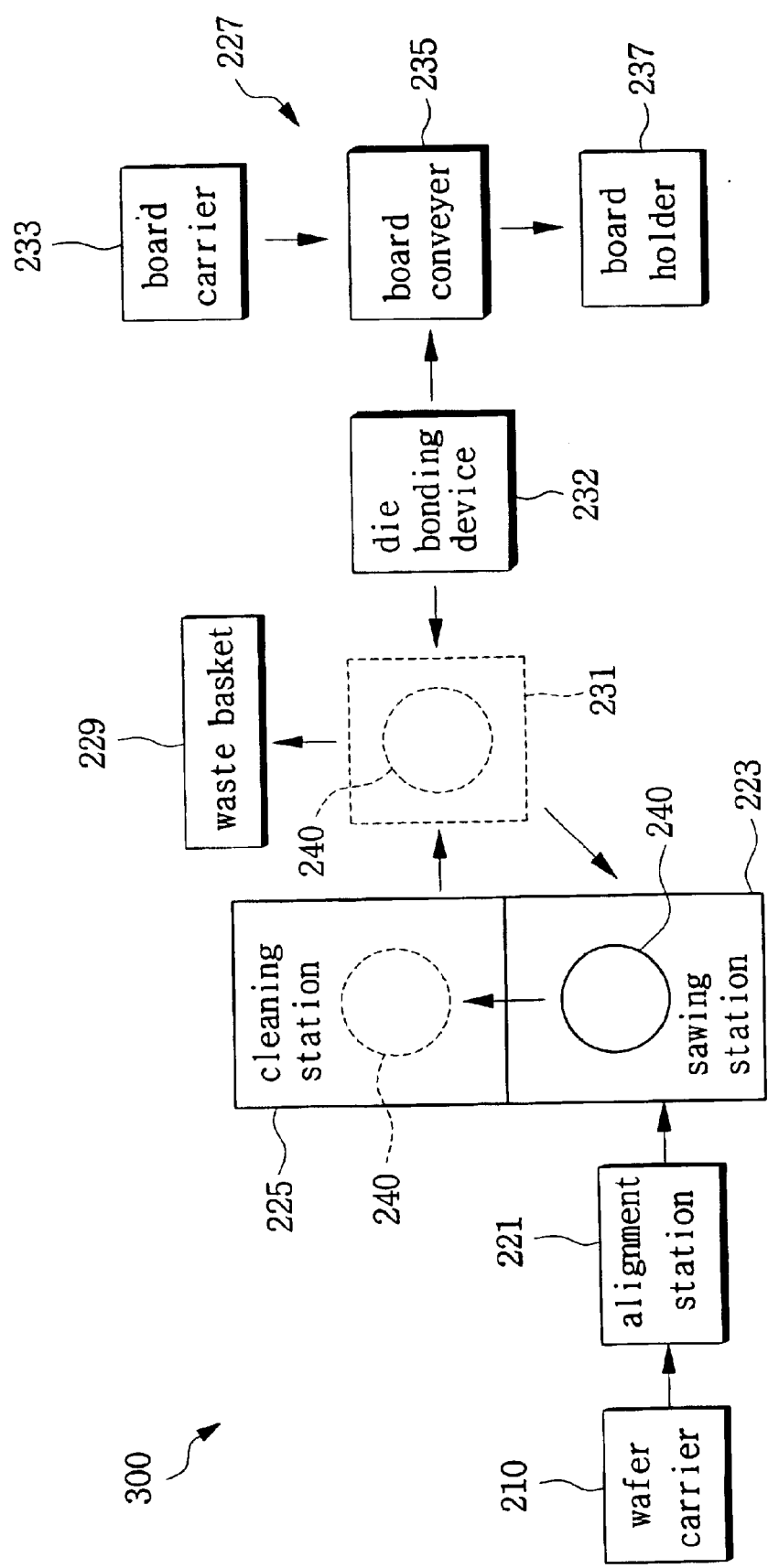
FIG. 8 shows a wafer sawing/die bonding apparatus according to a third exemplary embodiment of the invention.

The arrangement of the alignment station, the sawing station, the cleaning station and the die bonding stage can also be modified as shown in FIGS. 7 and 8. FIG. 7 shows an arrangement of a semiconductor package manufacturing apparatus 200 using a wafer table according to another embodiment of the invention. The arrangement of the alignment station 121, the sawing station 123, the cleaning station 125, and the die bonding stage 131 is similar to the arrangement illustrated in FIG. 6 in that the shape of the arrangement is rectangular. However, the board carrier 133, the board conveyer 135 and the board holder 137 are installed in front of the alignment station 121 and the die bonding stage 131. As illustrated, the wafer carrier 110 is preferably installed at the side of the board holder 137, and the waste receptacle 129 is preferably installed at the side of the board carrier 133.

FIG. 8 shows another exemplary arrangement of a semiconductor package manufacturing apparatus 300. In this arrangement, the alignment station 221 is installed at one side of the sawing station 223 and the cleaning station 225. In addition, the die bonding stage 232, the board carrier 233, the board conveyer 235 and the board holder 237 are installed at the other side of the sawing station 223 and cleaning station 225.

A semiconductor package manufacturing apparatus 400 for carrying out the sawing and loading processes for moving Wafer Level Chip Size Packages (WL CSPs) provided on a wafer to a sorting tray in an integrated process will be described with reference to FIGS. 9 and 10A–D.

Figure 9:
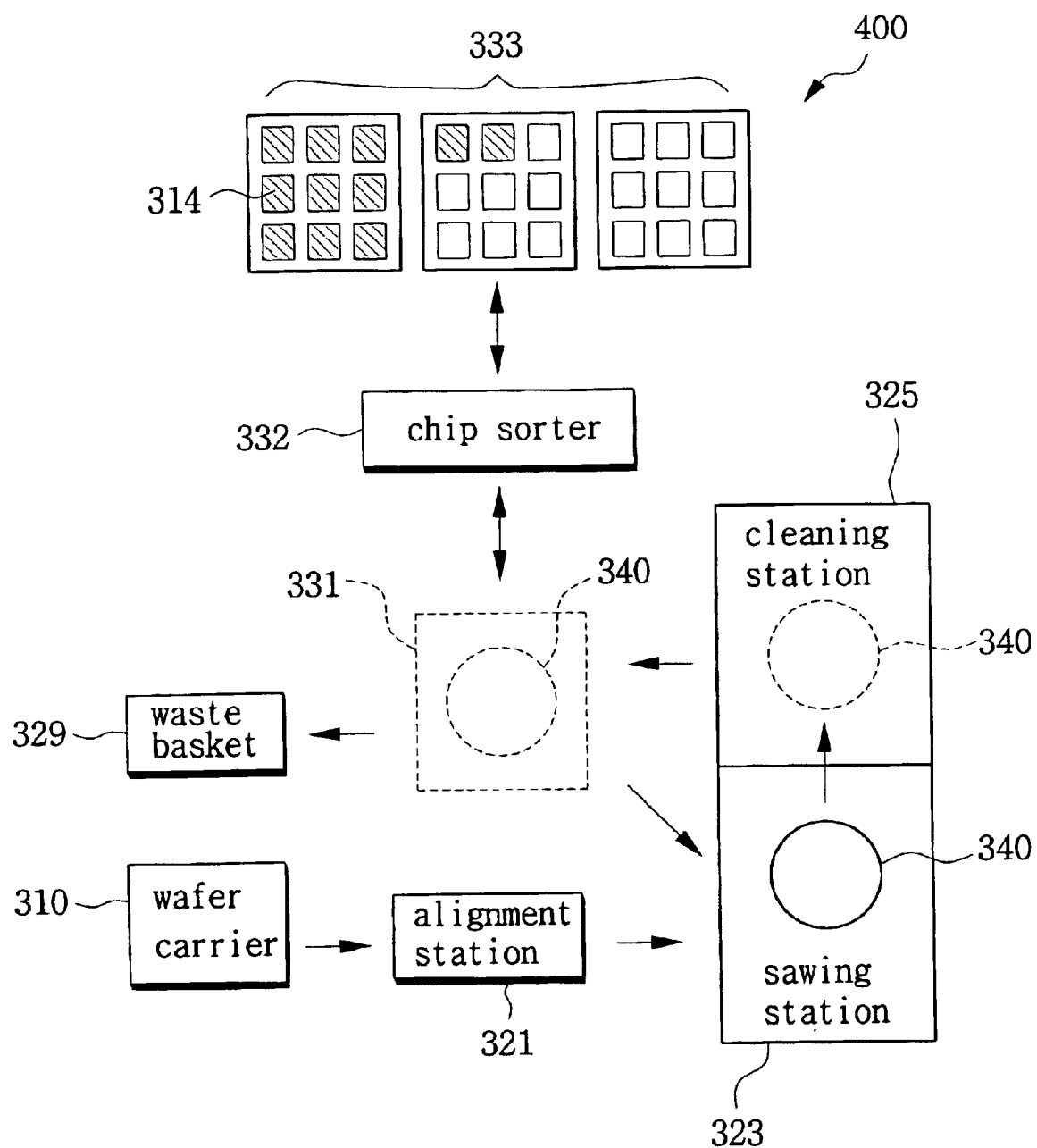
FIG. 9 shows a wafer sawing/chip sorting apparatus according to a fourth exemplary embodiment of the invention.

FIG. 9 shows the arrangement of an exemplary semiconductor package manufacturing apparatus 400. The semiconductor package manufacturing apparatus 400 is similar to semiconductor package manufacturing apparatus 100 with the addition of chip sorting station. The chip sorting station of apparatus 400 comprises a chip sorting stage 331, a chip sorter 332 for picking up individual chips 314, such as devices comprising WL CSPs, from the wafer table 340 and moving the chips to a sorting tray 333. The debris found on the wafer table 340 after the sawing process is preferably discharged into the waste receptacle 329. The wafer table 340, once substantially free of debris, may move from the chip sorting stage 331 to the sawing station 323. In other words, the wafer table 340 sequentially moves between the sawing station 323, the cleaning station 325 and the chip sorting stage 331.

Figure 10A:
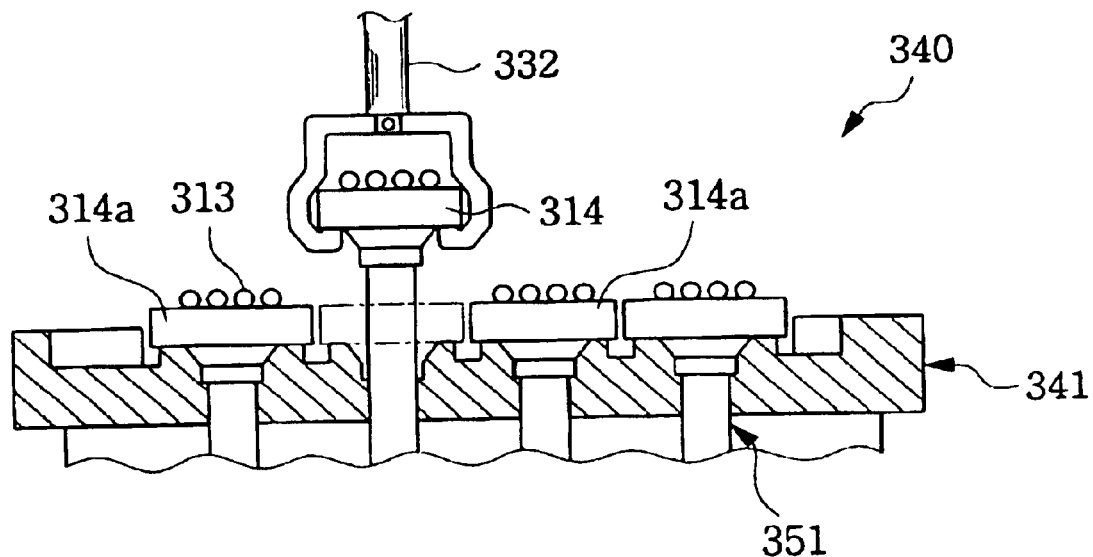
FIGS. 10A–D illustrate a chip transfer device receiving an individual Wafer Level Chip Size Package from an elevated chip absorber.

FIGS. 10A–D show an exemplary mechanism for sorting the individual chips, especially chips such as WL CSPs, after the wafer table 340 moves from the cleaning station 325 to the chip sorting stage 331. As shown in FIG. 10, external connecting means such as solder balls 313 are provided on the upper side of the individual chip 314. The chip absorber 351 elevates the corresponding individual chip 314 to separate it from adjacent chips 314a. Once the individual chip 314 has been elevated, a chip sorter 332 picks up the individual chip 314 and flips or inverts the individual chip so that the connecting means are on the lower surface before loading the chips into the sorting tray 333 or positioning the chip on a circuit board. By using a chip sorting mechanism as shown in FIG. 10A, the chip sorter 332 picks up the individual chip 314 only after the individual chip has been vertically separated from other individual chips 314a by a distance sufficient to reduce the likelihood mechanical of interference between the picked individual chip and the adjacent individual chips 314a that are not similarly elevated.

Figure 10B:
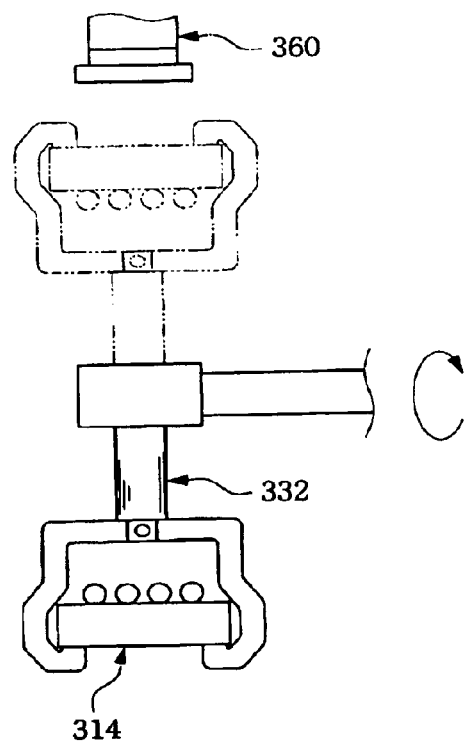
Figure 10C:
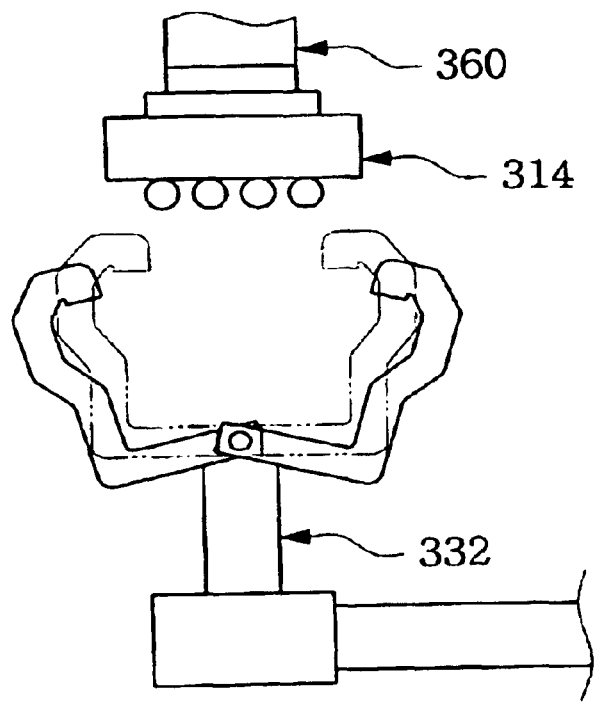
Figure 10D:
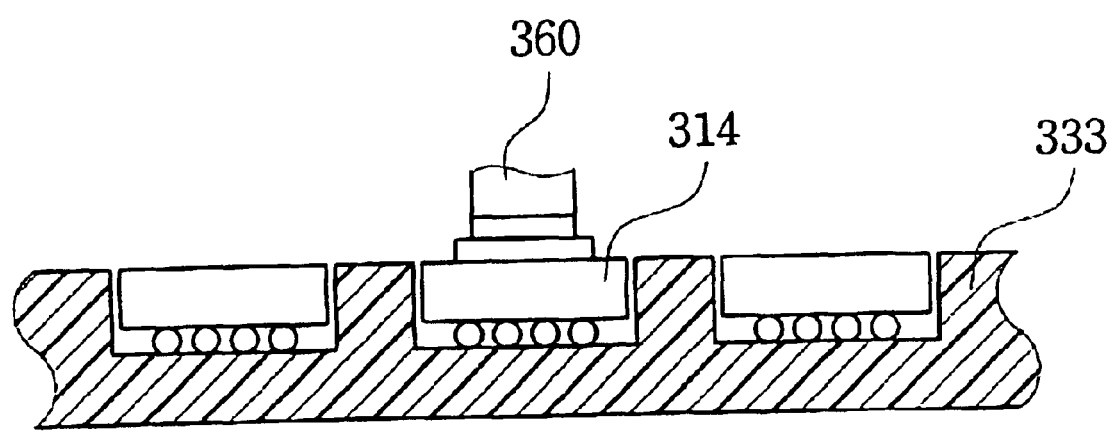

As illustrated in FIG. 10B, once the chip sorter 332 has removed the chip 314 from the chip absorber, a portion of the chip sorter can rotate to invert the orientation of the chip. Another chip transfer device 360, can then be used to remove the chip 314 from the chip sorter 332, typically by applying a vacuum to the exposed backside surface of the chip. As illustrated in FIG. 10C, once the chip transfer device 360 is fixed to the chip 314, the chip sorter 332 can release the chip for further movement by the chip transfer device. As illustrated in FIG. 10D, the chip transfer device 360 can then be used to deposit the inverted chip 314 into a chip holder 333 provided with a series of recesses for holding a plurality of chips.

Figure 11A:
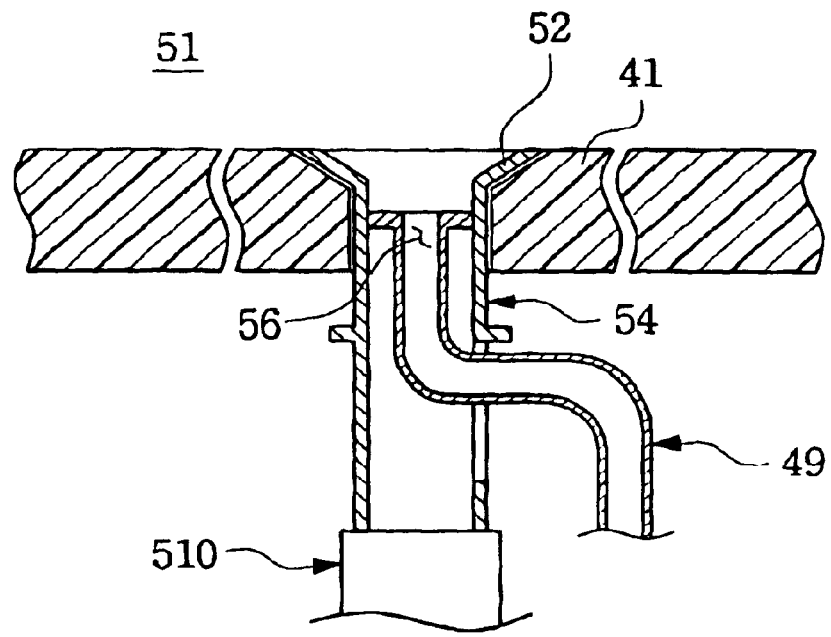
FIGS. 11A–B illustrate details of an exemplary chip absorber mechanism.
Figure 11B:
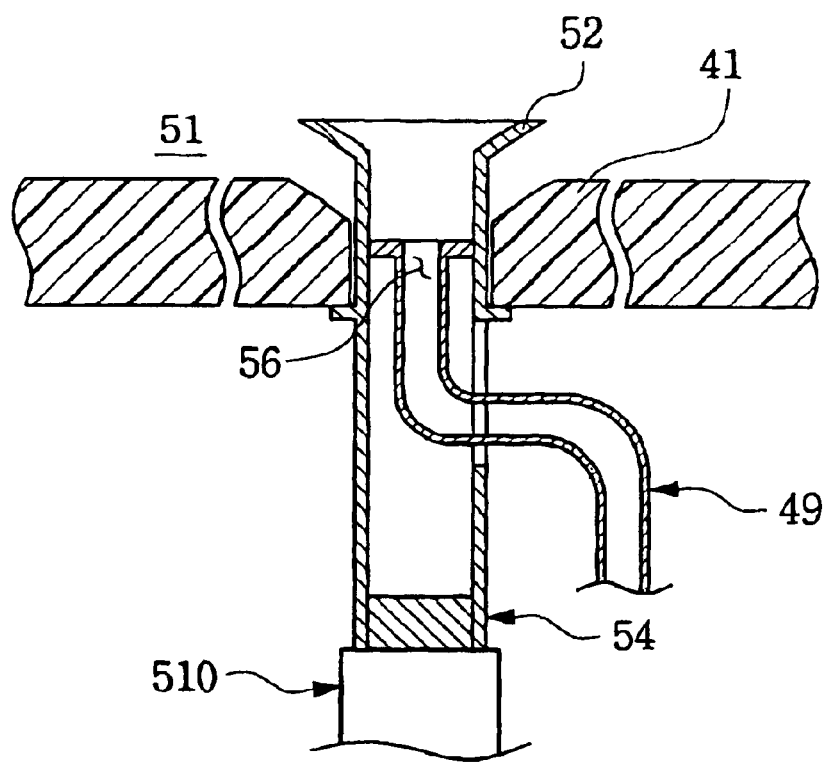

As illustrated in FIGS. 11A–B, in an exemplary embodiment, each chip absorber 51 includes a vacuum source 49 arranged and configured to provide vacuum at the mounting plate 52 of the chip absorber for fastening the wafer, and, after sawing, the individual chips, to the wafer table 40. The lower part of the vacuum source 49 is preferably connected to a transferring means, so that the vacuum source 49 remains active as the wafer table 40 moves between the sawing station 23, the cleaning station 25 and die bonding stage 31. The vacuum source 49 may extend through a slot in support 54 and be connected to an opening or port 56 provided within the support of the chip absorber in a manner that allows the mounting plate 52 and the support to move relative to the opening 56 as the chip absorber is raised and lowered by the actuator 510 as illustrated in FIG. 11B. As will be appreciated, in an alternative embodiment the opening 56 may be fixed relative to the mounting plate 52 and support 56 with a flexible or moveable portion being provided in the vacuum source 49 to accommodate movement of the chip absorber.

The chip sorting process can be performed only for operational chips, with debris such as malfunctioning chips or the edges of the wafer that remain on the wafer table 340 being subsequently discharged into the waste receptacle 329. If desired, the malfunctioning chips can be loaded into a second tray for reexamination and failure analysis rather than being immediately discarded. Similarly, if the selected chips are marked in a way to indicate various grades of performance, the chips transferred from the wafer table may be sorted into segregated receptacles.

Although the arrangement of the alignment station 321, the sawing station 323 and the cleaning station 325 of this exemplary embodiment is similar to the arrangement of the embodiment illustrated in FIG. 6, the arrangement of the stations associated with these chip mounting and/or sorting processes may be modified in accord with the embodiments illustrated in FIGS. 7–9 depending on the desired results, the particular equipment used and the space and facilities available for the installation.

It will be apparent to those skilled in the art that certain modifications and variations can be made in the wafer table, semiconductor assembly apparatus and method of extracting individual chips from a semiconductor wafer disclosed herein without departing from the scope of the invention defined by the appended claims.

What is claimed is:

1. A method of extracting an individual chip from a semiconductor wafer comprising a plurality of individual chips separated by scribe lines comprising:

positioning the wafer on a wafer table, the wafer table having an absorption plate having an upper face for supporting a lower surface of the wafer and a plurality of chip absorbers provided on the absorption plate, each chip absorber corresponding to and arranged below one of the plurality of individual chips;

removably attaching the semiconductor wafer to the wafer table by applying a vacuum directly to portions of the lower surface of the semiconductor wafer adjacent the chip absorbers;

sawing the wafer along the scribe lines to separate the individual chips from one another, each individual chip being removably attached to a corresponding chip absorber by vacuum applied to a rear surface of the chip;

selectively elevating a first chip relative to the upper face of the adsorption plate by raising the corresponding chip absorber; and transferring the first chip from the corresponding chip absorber to a chip transfer device.

2. A wafer table for supporting a wafer comprising:

an absorption plate having an upper face for supporting a first major surface of the wafer, a plurality of individual chips separated by a plurality of scribe lines being arranged on a second major surface of the wafer;

a plurality of chip absorbers provided on the absorption plate, each chip absorber corresponding to and arranged below one of the plurality of individual chips; and a vacuum port provided on each of the chip absorbers for selectively applying a vacuum to a portion of the first major surface of the wafer adjacent the chip absorber; and an actuating means for selectively and independently elevating each of the chip absorbers a predetermined distance above a plane generally corresponding to the face of the absorption plate.

3. The wafer table according to claim 2, wherein each of the chip absorbers further comprises:

a mounting plate having an upper surface and a lower surface, the lower surface configured to cooperate with a corresponding recess formed in the absorption plate to limit downward travel of the chip absorber.

4. The wafer table according to claim 3, wherein each of the chip absorbers further comprises:

a support arranged below and attached to the mounting plate, wherein the support extends through an opening in the absorption plate and is provided with a stop, the stop arranged and configured to interact with the absorption plate to limit the upward travel of the chip absorber.

5. The wafer table according to claim 2, wherein the actuating means is arranged and configured to elevate a predetermined chip absorber using a motive force applied by a mechanism selected from a group consisting of magnetic, electrical, pneumatic and hydraulic mechanisms.

6. The wafer table according to claim 5, wherein the actuating means includes a plurality of actuating means arranged and configured whereby a first group of chip absorbers may be independently elevated by a first actuating means and a second group of chip absorbers may be independently elevated by a second actuating means.

7. The wafer table according to claim 5, wherein the actuating means may be positioned to engage and elevate any one of the plurality of chip absorbers.

8. The wafer table according to claim 5, wherein:

a vacuum port arranged within an associated chip absorber remains in a relatively fixed orientation relative to the absorption plate when the actuating means elevates the associated chip absorber.

9. The wafer table according to claim 5, wherein the actuating means includes a plurality of actuating means arranged and configured to elevate each chip absorber through the action of a single corresponding actuating means.

10. The wafer table according to claim 2, wherein the absorption plate further comprises:
a plurality of sawing guide grooves corresponding to the scribe lines separating the individual chips on the second major surface of the wafer.

11. The wafer table according to claim 10, wherein:
the sawing guide grooves are wider than the scribe lines and are sufficiently deep to avoid substantial contact between the absorption plate and a cutting means used to separate the individual chips.

12. A semiconductor assembly apparatus according to claim 11, further comprising:
a circuit board carrier for maintaining a first plurality of circuit boards;
a circuit board receiver for receiving a second plurality of circuit boards;
a conveyor for moving a circuit board from the circuit board carrier to the circuit board receiver; and
a board alignment station arranged between the circuit board carrier and the circuit board receiver for sequentially receiving and orienting a plurality of conveyed circuit boards relative to the die bonding stage;
wherein the chip positioning device is arranged and configured to remove an individual chip from an elevated chip absorber at the die bonding stage and place the removed individual chip at a predetermined mounting location on an aligned circuit board residing in the board alignment station.

13. A semiconductor assembly apparatus according to claim 12, further comprising:
a wire bonding device for establishing electrical connections between bonding regions on the removed individual chip and the circuit board onto which the individual chip was placed by the chip positioning device.

14. A semiconductor assembly apparatus comprising:
an alignment station for receiving and aligning a wafer on a wafer table, the wafer table being configured according to claim 11;
a sawing station arranged and configured to receive the wafer table and the aligned wafer and remove at least those portions of the wafer under the scribe lines to separate the wafer into individual chips, the individual chips being maintained in an aligned configuration on the chip absorbers;
a cleaning station arranged and configured to receive the wafer table and the individual chips for removing debris remaining from the sawing station;
a die bonding stage arranged and configured to receive and orient the wafer table; and
a chip positioning device arranged and configured for removing individual chips from elevated chip absorbers at the die bonding stage and placing the removed individual chips in a predetermined location with a predetermined orientation.

15. A semiconductor assembly apparatus according to claim 14, further comprising:
first and second wafer tables,
each wafer table having
an absorption plate having an upper face for supporting a first major surface of the wafer, a plurality of individual chips separated by a plurality of scribe lines being arranged on a second major surface of the wafer, wherein the absorption plate also includes a plurality of sawing guide grooves corresponding to the scribe lines;
a plurality of chip absorbers provided on the absorption plate, each chip absorber corresponding to and arranged below one of the plurality of individual chips;
a vacuum port provided on each of the chip absorbers for selectively applying a vacuum to a portion of the first major surface of the wafer adjacent the chip absorber; and
an actuating means for selectively and independently elevating each of the chip absorbers a predetermined distance above a plane generally corresponding to the face of the absorption plate;
wherein the first and second wafer tables are arranged and configured to move independently and sequentially through the alignment station, the sawing station, the cleaning station and the die bonding stage.

16. A semiconductor assembly apparatus according to claim 14, wherein:
the sawing station includes a chamber arranged and configured for temporarily and substantially enclosing the wafer table when located at the sawing station; and
the cleaning station includes a chamber arranged and configured for temporarily and substantially enclosing of the wafer table when located at the cleaning station.

17. A semiconductor assembly apparatus according to claim 14, further comprising:
a chip sorting tray having a plurality of chip receptacles;
wherein the chip positioning device is arranged and configured to remove an individual chip from an elevated chip absorber at the die bonding stage and place the removed individual chip into a predetermined chip receptacle of the chip sorting tray.

18. A semiconductor assembly apparatus according to claim 17, wherein:
the chip positioning device is arranged and configured to invert the removed individual chip before placing the removed individual chip in the predetermined chip receptacle of the chip sorting tray.

19. A semiconductor assembly apparatus according to claim 18, wherein the chip position device further comprises:
a nipper arranged and configured to remove the individual chip from the elevated chip absorber and invert the removed individual chip and expose a backside surface of the removed individual chip;
a chip transfer device arranged and configured to attach to the backside surface of the removed individual chip, separate the removed individual chip from the nipper and deposit the removed individual chip in the predetermined chip receptacle of the chip sorting tray.

20. A method of extracting an individual chip from a semiconductor wafer according to claim 19, further comprising:
indexing the wafer table to place the first chip in a predetermined transfer location prior to raising a first corresponding chip absorber;

transferring the first chip to the chip transfer device;

lowering the first corresponding chip absorber after the first chip has been transferred;

repositioning the chip transfer device and releasing the first chip;

indexing the wafer table to place a second chip in the predetermined transfer location;

raising a second corresponding chip absorber;

transferring the second chip from the second corresponding chip absorber to the chip transfer device;

lowering the second corresponding chip absorber after the second chip has been transferred to the chip transfer device; and repositioning the chip transfer device and releasing the second chip.

\* \* \* \* \*